United States Patent [19]

Peltz

[11] 4,382,225
[45] May 3, 1983

[54] SIGNAL INDICATING FUSE TESTING APPARATUS

[75] Inventor: John R. Peltz, Warren, Pa.

[73] Assignee: GTE Products Corporation, Stamford, Conn.

[21] Appl. No.: 226,664

[22] Filed: Jan. 21, 1981

[51] Int. Cl.³ .............................................. G01R 31/02
[52] U.S. Cl. ..................... 324/73 R; 324/51; 340/639
[58] Field of Search ............ 324/51, 52, 73 R, 158 R, 324/403, 406, 414, 424; 340/638, 639, 644

[56] References Cited

U.S. PATENT DOCUMENTS

| | | | |
|---|---|---|---|
| 3,277,364 | 10/1966 | Abrahamson | 324/51 X |
| 3,440,524 | 4/1969 | De Jarld et al | 340/644 X |
| 3,611,364 | 10/1971 | Jones | 340/644 X |
| 3,798,540 | 3/1974 | Darden et al. | 324/51 |
| 3,842,343 | 10/1974 | Taylor et al. | 324/414 |
| 3,967,192 | 6/1976 | Kellog et al. | 324/414 |

Primary Examiner—Gerard R. Strecker
Attorney, Agent, or Firm—John A. Odozynski

[57] ABSTRACT

An apparatus for testing signal indicating fuses. The apparatus comprises test positions for the acommodation of N fuses, each test position having a common, a normally open (NO), and a normally closed (NC) terminal. When the test positions are filled with N functional fuses, the fuses are, in effect, connected in series across a regulated current source. In the event that one of the fuses becomes open, the series circuit is momentarily broken, thereby triggering an associated SCR which in turn lights a lamp indicating which fuse has blown. Shortly afterwards the fuse flag will make contact with its alarm (NO) terminal, thereby reclosing the circuit. The apparatus may include or be coupled to a multichannel event timer in order to indicate the time, as measured from the start of the test, at which individual fuses failed.

18 Claims, 1 Drawing Figure

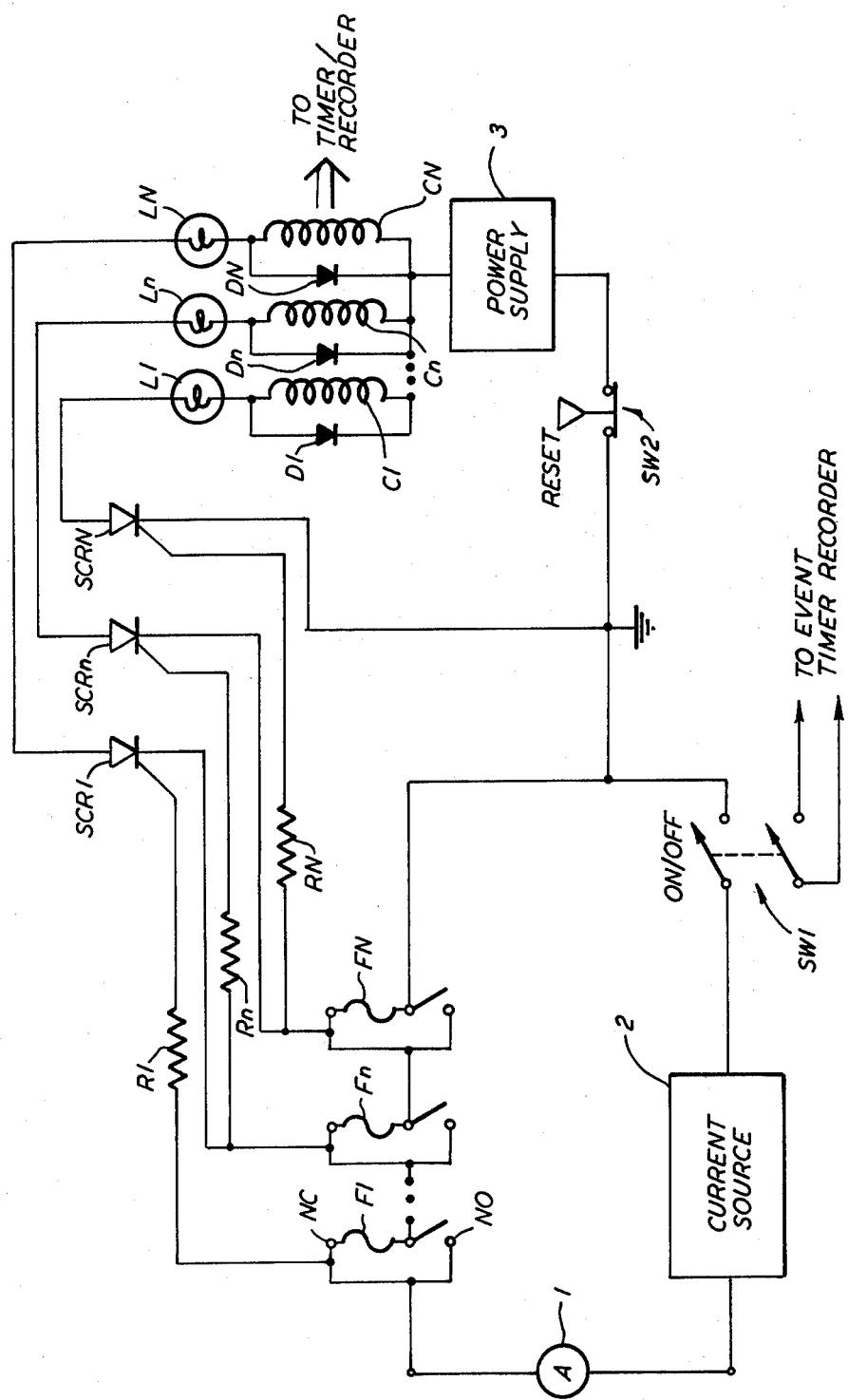

SIGNAL INDICATING FUSE TESTING APPARATUS

TECHNICAL FIELD

This invention relates to electronic test equipment and more particularly to an apparatus for testing signal indicating fuses.

BACKGROUND OF THE INVENTION

Signal indicating fuses differ from conventional fuses in that they comprise three, rather than two, terminals. The three terminals may be characterized as a common terminal, a normally closed (NC) terminal, and a normally open (NO) or alarm terminal. The portion of the fuse extending between the common and NC terminals corresponds to a conventional fuse. When functional it approximates a short circuit; after fuse failure it approximates an open circuit. The signal indicating fuse also includes a "flag" section extending between the common and the NO terminals. While the fuse remains functional, this section approximates an open circuit; after fuse failure a contact closure, approximating a short circuit, is made between the common and NO terminals.

The purpose of this invention is to provide a simple, economical apparatus for testing signal indicating fuses of various current ratings. This had been done by testing individual fuses with a power supply and a timer. Because this method is both time consuming and cumbersome, an improved procedure was sought. Furthermore, it is clearly more efficient to test a number, say N, fuses at a single test. However, given the apparatus then available, a test of N fuses required a power supply capable of providing a current on the order of N times the fuse rating.

DISCLOSURE OF THE INVENTION

The above and other objects and advantages are achieved in one aspect of the invention by a signal indicating fuse testing apparatus for test N, were $N \geq 2$, fuses. The apparatus comprises N test positions, each having a common, a normally closed (NC), and a normally open (NO) terminal, N indicating means, each associated with a respective test position, and N controllable switching devices, each having a gate, a cathode, and an anode.

The respective NO terminal and NC terminal of each of the N test positions are interconnected; the NO and NC terminals of the 1st test position are adapted for coupling to a current source; the common terminal of the Nth test position is coupled to a reference potential and the common terminal of each of the n, where $1 \leq n < N$, remaining test positions is coupled to the NO and NC terminals of the (n+1)th test position; the gate electrode of each of the N controllable switching devices is coupled to the NC terminal of an associated test position; the anode electrode of each of the N controllable switching devices is coupled to an associated one of the N indicating means; the cathode electrode of the Nth controllable switching device is coupled to the reference potential; and the cathode electrode of each of the n, where $1 \leq n < N$, remaining controllable switching devices is coupled to the NC terminal of the (n+1)th test position.

BRIEF DESCRIPTION OF THE DRAWING

The drawing is a schematic diagram of the subject apparatus for testing signal indicating fuses.

BEST MODE FOR CARRYING OUT THE INVENTION

For a better understanding of the present invention, together with the objects, advantages and capabilities thereof, reference is made to the following diclosure and appended claims, in conjunction with the accompanying drawing and in connection with the above description of some of the aspects of the invention.

Referring now to the drawing, the subject apparatus for testing signal indicating fuses comprises N test positions where N may take on values equal to or greater than 2. Each test position comprises a common terminal, a normally closed (NC) terminal, and a normally open (NO) terminal for accommodating the associated terminals of the fuses under test. (For the sake of completeness and in order to facilitate an understanding of this invention, the drawing depicts the fuses as they would appear under test; however, the fuses per se are considered to be no part of this invention.) Each of the test positions has the NC terminal electrically connected to the NO terminal. The NC and NO terminals of the 1st test position are coupled through a current monitoring means in the form of an ammeter 1 to a current source 2. The current source is in turn coupled through a first pair of terminals of a double-pole, single-throw ON/OFF switch, SW1, to a reference potential, i.e., ground. The common terminal of the Nth test position is likewise coupled to ground; whereas the common terminal of the remaining n, where $n \neq N$ (that is, where n is not equal to N), and may take on values from 1 to (N−1) is coupled to the commonly connected NO and NC terminals of the (n+1)th test position. That is, the common terminal of the 1st test position is coupled to the NO and NC terminals of the 2nd test position, the common terminal of the 2nd test position is coupled to the NO and NC terminals of the 3rd test position, and so on.

The NO and NC terminals of each test position are coupled through associated resistors R1, ... Rn, ... RN to the gate electrodes of associated controllable switching devices in the form of silicon controlled rectifiers SCR1, ... SCRn, ... SCRN. The illustration of switching devices as silicon controlled rectifiers is deemed to be exemplary and other types of controllable switching devices may be used without departure from the scope of this invention. SCRN has a cathode electrode coupled to ground. The cathode electrode of the remaining switching devices, designated SCRn for generality, (as in above $n, \neq N$ and may take on values from 1 to (N−1) are coupled to the NO and NC terminals of the (n+1)th test position. That is, the cathode electrode of SCR1 is coupled to the NO and NC terminals of test position 2, the cathode of SCR2 is coupled to the NO and NC terminals of test position 3, and so on. Each of the controllable switching devices, SCR1 through SCRN, has an anode electrode coupled to one of N associated indicating means.

The indicating means may comprise lamps L1, ... Ln, ... LN, each coupled at one end to an associated switching device. The other end of each lamp is coupled through parallel-connected diodes, D1, ... Dn, ... DN, and relay coils, C1, ... Cn, ... CN, to the output of a power supply 3. The power supply is returned to ground through a RESET switch, SW2, and is used to supply power to the SCRs, the lamps and the relay coils. The relay coils may be part of an Event Timer/Recorder (not shown), the operation of which will be described below.

As to operation of the subject invention, assume now that each of the N test positions is filled with a functioning fuse. The NO and NC terminals of each of the test positions will exhibit electrical continuity (i.e., approximate a short circuit). Depression of the ON/OFF will return the current source to ground and the fuses will, in effect, be connected in series from the current source through the ammeter to ground. The current source can be set, using the ammeter as an indication, to establish the desired current flow through the fuses. In a specific embodiment, depression of SW1 may close a second pair of terminals in that switch, thereby initiating the operation of the Event Timer/Recorder.

Suppose now that the current supplied by the current source should exceed the current handling capabilities of any of the fuses F1 through FN. The fuse will "blow", thereby destroying the electrical continuity between the common terminal and NC terminal of the associated test position. Before continuity is established between the common terminal and the NO terminal of that test position, a momentary open circuit will occur and the output of the current source will be applied to the gate electrode of the associated SCR. The SCR will be triggered, i.e., become conductive, thereby illuminating an associated lamp and pulling in a relay coil through the power supply. The lamp will indicate which fuse or fuses have "blown" and the Event Timer/Recorder will indicate the time at which the failure occurred.

After the momentary open circuit continuity will be established between the common terminal and the NO terminal of the test position and the remaining fuses will again be connected in series across the current source. However, because the SCR is, as is well known by those skilled in the art, a "latching" switch, it will remain conductive, and the associated lamp or lamp will remain lit. The lamps may be extinguished and the Recorder coils deactivated by depressing the RESET switch SW2. This separates the power supply from ground and interrupts the current flow through the coils, the lamps, and the conducting SCR's. The SCR's will remain nonconducting until a fuse is removed from the test position or a replacement fuse fails.

It should be noted that although the subject invention was described in conjunction with ancillary equipment such as the Event Timer/Recorder, the current source, ammeter and power supply, those equipments are not considered elemental aspects of the invention but, although preferrable or necessary (as in the case of the current source and power supply), deemed embellishments that may be routinely supplied by one having limited knowledge regarding the use of electronic test equipment. Accordingly, while there has been shown and described what are at present considered the preferred embodiments of the invention, it will be obvious to those skilled in the art that various changes and modifications may be made therein without departing from the scope of the invention as defined by the appended claims.

INDUSTRIAL APPLICABILITY

This invention is useful in the manufacture, test and use of signal indicating fuses.

What is claimed is:

1. An apparatus for testing N signal indicating fuses, when N is greater than or equal to 2 the apparatus comprising N test positions, each having a common terminal a normally open terminal, NO, and a normally closed terminal, NC, N indicating means, a current source, and N controllabled switching devices, each having a gate electrode, an anode electrode and a cathode electrode, wherein
   (a) the respective NO terminal and NC terminal of each of the N test positions are interconnected,
   (b) the NO and NC terminals of the 1st test position are coupled to the current source;
   (c) the common terminal of the Nth test position is coupled to a reference potential and the common terminal of each of the remaining n, where $1 \leq n < N$, test position is coupled to the NO and NC terminals of the (n+1)th test position;
   (d) the gate electrode of each of the N controllable switching devices is coupled to the NC terminal of a respective test position;
   (e) the anode electrode of each of the N controllable switching devices is coupled to a respective one of the N indicating means;
   (f) the cathode electrode of the Nth controllable switching device is coupled to the reference potential and the cathode electrode of each of the remaining n, where $1 \leq n < N$, controllable switching devices is coupled to the NC terminal of the (n+1)th test position.

2. An apparatus as defined in claim 1 wherein each of the N indicating means comprises a lamp coupled to the anode electrode of a respective one of the N controllable switching devices.

3. An apparatus as defined in claim 2 wherein each of the N indicating means further comprises N means for actuating an Event Timer/Recorder, each of said N means for activating an Event Timer/Recorder coupled to the anode electrode of a respective one of the N controllable switching devices.

4. An apparatus as defined in claim 3 wherein the N means for actuating an Event Timer/Recorder each comprises a parallel-connected diode and relay coil.

5. An apparatus as defined in claim 1 wherein the NO and NC terminals of the 1st test position are coupled to the current source through current monitoring means.

6. An apparatus as defined in claim 1 wherein the N controllable switching devices are silicon controlled rectifiers.

7. An apparatus as defined in claim 6 wherein the gate electrode of each of the N silicon controlled rectifiers is coupled to the NC terminal of a respective test position through a resistor.

8. An apparatus as defined in claim 1 wherein the current source is coupled to a reference potential via an ON/OFF switch, said switch for enabling operation of the apparatus.

9. An apparatus as defined in claim 8 wherein the ON/OFF switch is a double-pole, single throw switch having a first pair of terminals coupled between the current source and the reference potential and a second pair of terminals adapted to be coupled to an Event Timer Recorder for activating the Recorder simultaneously with the enabling of the apparatus.

10. An apparatus as defined in claim 1 further comprising a power supply coupled between the N indicating means and a reference potential, said power supply for supplying power to the N indicating means and the N controllable switching devices.

11. An apparatus as defined in claim 10 further comprising resetting means for interrupting the supply of power to, and thereby resetting, the N indicating means and the N controllable switching devices.

12. An apparatus as defined in claim 11 wherein the resetting means comprises a switch coupled between the power supply and the reference potential.

13. An apparatus for testing N signals indicating fuses, where N is greater than or equal to 2, the apparatus comprising N test positions for accommodating N signal indicating fuses, each test position having a common terminal, a normally open terminal, NO, and a normally closed terminal, NC;

N indicating means, each associated with a respective one of the N test positions, and N controllable switching devices each having a gate electrode, an anode electrode, and a cathode electrode wherein:
(a) the respective NO terminal and NC terminal of each of the N test Positions are interconnected;
(b) the NO and NC terminals of the 1st test position are adapted for coupling to a current source;
(c) the common terminal of the Nth test position is coupled to a reference potential and the common terminal of each of the n, where 1 N N, remaining test positions is coupled to the NO and NC terminals of the (n+1)th test position;
(d) the gate electrode of each of the N controllable switching devices is coupled to the NC terminal of an associated test position;
(e) the anode electrode of each of the N controllable switching devices is coupled to an associated one of the N indicating means, and
(f) the cathode electrode of the Nth controllable switching device is coupled to the reference potential and the cathode electrode of each of the n, where $1-n$ N, remaining controllable switching devices is coupled to the NC terminal of the (n+1)th test position.

14. An apparatus as defined in claim 13 further comprising ON/OFF switching means for enabling operation of the apparatus, said ON/OFF switching means coupled to the reference potential and adapted for coupling to the current source.

15. An apparatus as defined in claim 13 wherein each of the N indicating means is adapted for coupling to a power supply, said power supply for supplying power to each of the N indicating means and to an associated one of the N controllable switching devices.

16. An apparatus as defined in claim 15 further comprising resetting means coupled to the reference potential and adapted for coupling to the power supply, said resetting means for interrupting the supply of power to the N indicating means and the N controllable switches.

17. An apparatus as defined in either claim 13 or claim 16 wherein the N controllable switching devices are silicon controllable rectifiers.

18. An apparatus as defined in claim 17 wherein the gate electrode of each of the N silicon controlled rectifiers is coupled through a resistor to the NC terminal of an associated test position.

* * * * *